(12) United States Patent
Kitagawa

(10) Patent No.: US 10,051,734 B2
(45) Date of Patent: Aug. 14, 2018

(54) WIRING BOARD AND METHOD FOR MANUFACTURING THE SAME

(71) Applicant: IBIDEN CO., LTD., Ogaki (JP)

(72) Inventor: Katsutoshi Kitagawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/452,775

(22) Filed: Mar. 8, 2017

(65) Prior Publication Data

US 2017/0265299 A1    Sep. 14, 2017

(30) Foreign Application Priority Data

Mar. 8, 2016  (JP) .................................. 2016-044499

(51) Int. Cl.
| | |
|---|---|
| *H05K 1/11* | (2006.01) |
| *H05K 1/02* | (2006.01) |
| *H05K 3/40* | (2006.01) |
| *H05K 3/00* | (2006.01) |

(52) U.S. Cl.
CPC ............. *H05K 1/111* (2013.01); *H05K 1/028* (2013.01); *H05K 3/0011* (2013.01); *H05K 3/4007* (2013.01)

(58) Field of Classification Search
CPC ...... H05K 1/11–1/119; H05K 1/10416; H05K 1/4056; H05K 1/0206; H05K 2201/10696; H05K 2201/09554; H05K 2201/09581; H05K 2201/0949; H05K 2201/09863; H05K 2201/09745; H05K 2201/0969; H05K 2201/099; H05K 2201/09472; H05K 2201/037; H05K 2201/09454; H05K 2201/09463; H05K 2201/09381; H05K 2201/09536; H05K 1/114; H01L 21/4882; H01L 23/367
USPC ...................................................... 361/720
See application file for complete search history.

(56) References Cited

U.S. PATENT DOCUMENTS

| | | | | |
|---|---|---|---|---|
| 6,459,585 B1 * | 10/2002 | Bergstedt | ............ | H05K 1/0204 174/15.1 |
| 6,730,856 B2 * | 5/2004 | Furukuwa | ........... | H01L 23/3735 174/256 |
| 6,828,661 B2 * | 12/2004 | Araki | ................... | H01L 21/568 257/666 |
| 6,882,544 B2 * | 4/2005 | Nakamura | ........ | H01L 23/49816 174/260 |
| 8,772,646 B2 * | 7/2014 | Ueda | ................. | H01L 23/49816 174/252 |
| 9,363,885 B1 | 6/2016 | Taneko et al. | | |

(Continued)

FOREIGN PATENT DOCUMENTS

WO    WO 2014/199456 A1    12/2014

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A wiring board includes a substrate, a surface protection film laminated on the substrate and having an opening portion, and a conductor block embedded in the substrate and having a pad portion exposed by the opening portion of the surface protection film. The conductor block has an annular groove formed such that the annular groove is surrounding the pad portion of the conductor block, and the surface protection film is formed such that a portion of the surface protection film is extending into the annular groove.

20 Claims, 8 Drawing Sheets

(56) References Cited

U.S. PATENT DOCUMENTS

| | | | | |
|---|---|---|---|---|
| 9,560,739 B2* | 1/2017 | Nishida | ............... | H05K 3/3452 |
| 2004/0042185 A1* | 3/2004 | Kung | ................. | H01L 23/3677 |
| | | | | 361/760 |
| 2013/0187188 A1* | 7/2013 | Sasaoka | .............. | H05K 1/0313 |
| | | | | 174/255 |
| 2015/0382444 A1* | 12/2015 | Lin | .................... | H01L 23/3677 |
| | | | | 361/709 |
| 2016/0050771 A1* | 2/2016 | Yu | ....................... | H05K 1/0204 |
| | | | | 29/852 |
| 2016/0293535 A1* | 10/2016 | Fukasawa | ........ | H01L 23/49838 |

* cited by examiner

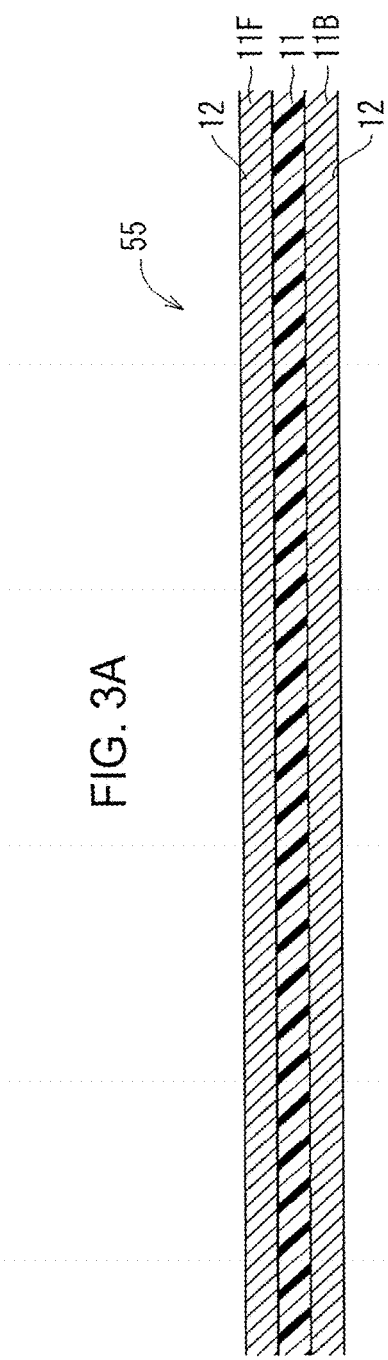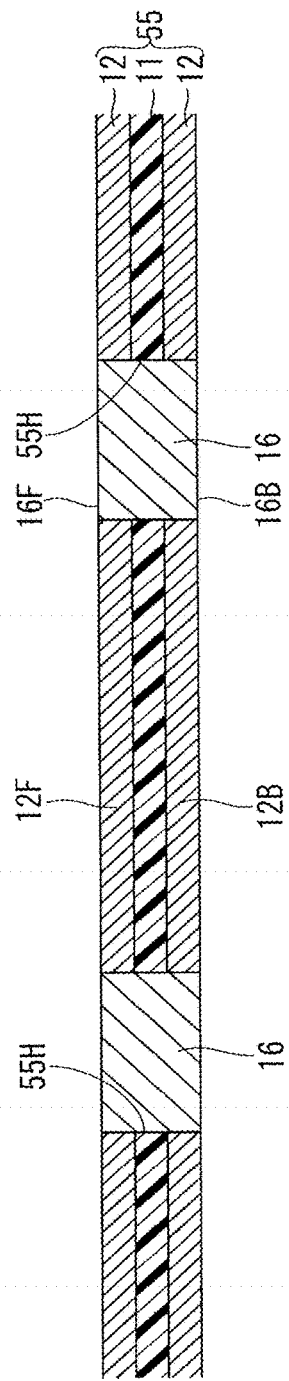

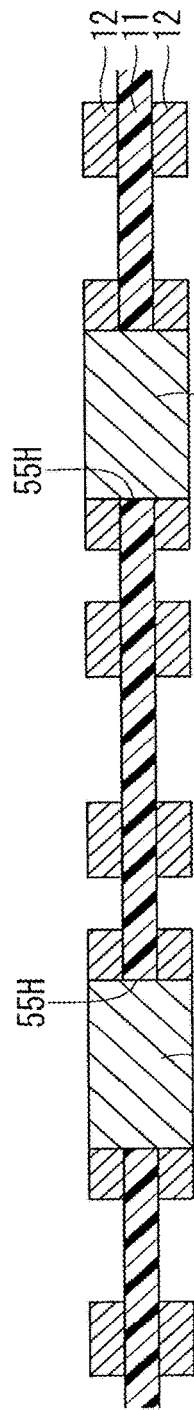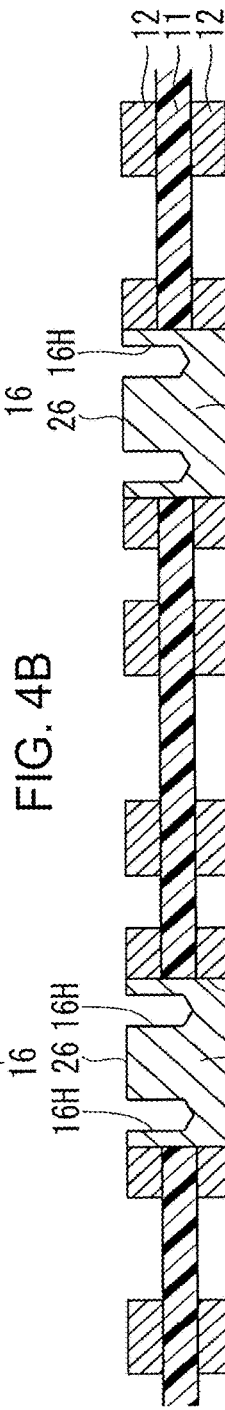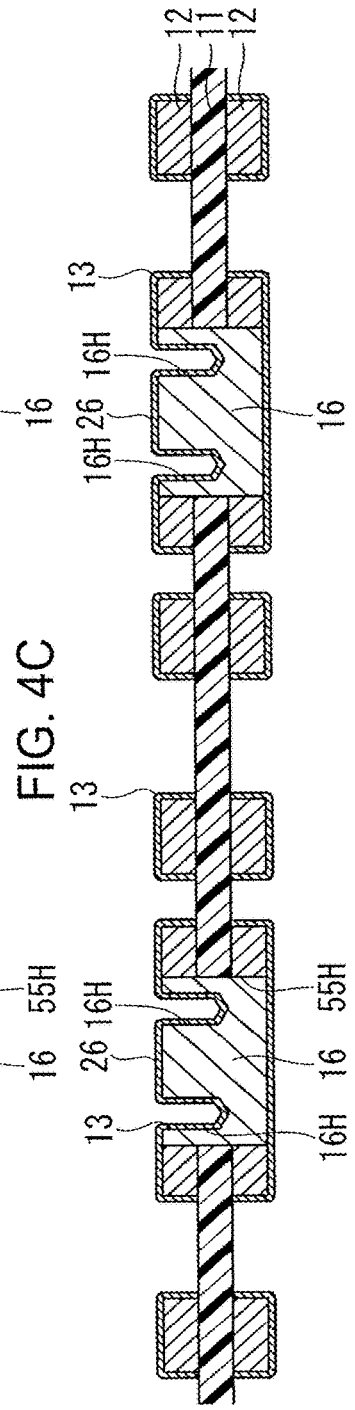

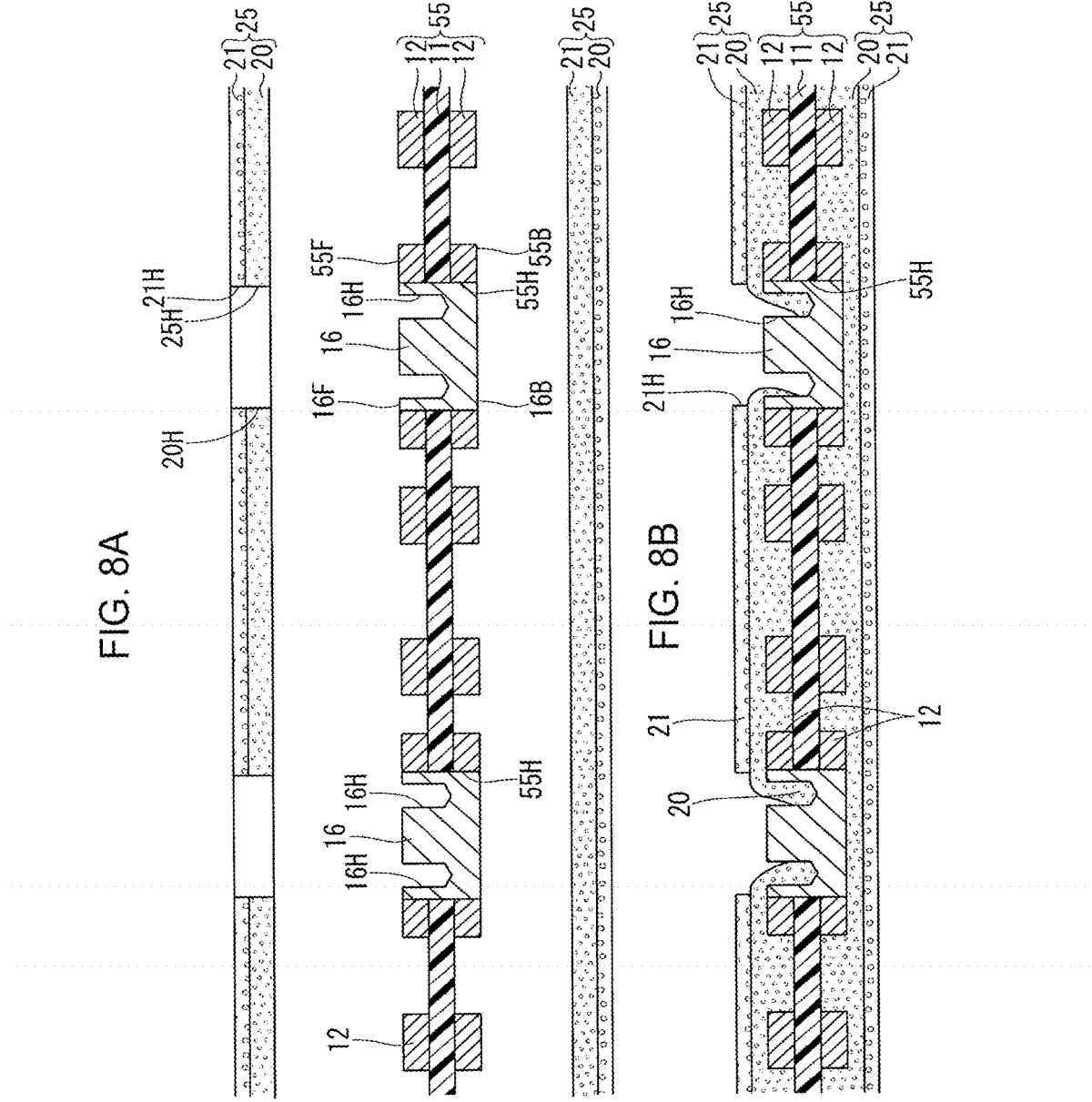

WIRING BOARD AND METHOD FOR MANUFACTURING THE SAME

CROSS-REFERENCE TO RELATED APPLICATIONS

The present application is based upon and claims the benefit of priority to Japanese Patent Application No. 2016-044499, filed Mar. 8, 2016, the entire contents of which are incorporated herein by reference.

BACKGROUND OF THE INVENTION

Field of the Invention

The present invention relates to a wiring board that is obtained by laminating a surface protection film on a substrate in which a conductor block is embedded, and relates to a method for manufacturing the wiring board.

Description of Background Art

International Publication No. 2014/199456 describes a wiring board in which a pad is provided on a portion of a substrate exposed from an opening part of a surface protection film. The entire contents of this publication are incorporated herein by reference.

SUMMARY OF THE INVENTION

According to one aspect of the present invention, a wiring board includes a substrate, a surface protection film laminated on the substrate and having an opening portion, and a conductor block embedded in the substrate and having a pad portion exposed by the opening portion of the surface protection film. The conductor block has an annular groove formed such that the annular groove is surrounding the pad portion of the conductor block, and the surface protection film is formed such that a portion of the surface protection film is extending into the annular groove.

According to another aspect of the present invention, a method for manufacturing a wiring board includes providing a substrate having a conductor block embedded in the substrate, forming an annular groove on a surface of the conductor block such that the annular groove surrounds a portion of the surface of the conductor block, forming, on the substrate, a surface protection film having an opening portion in a semi-cured state such that the surface protection film is laminated on the substrate in the semi-cured state and has a portion extending into the annular groove, forming a pad portion in the portion of the conductor block exposed by the opening portion of the surface protection film such that the annular groove surrounds the pad portion of the conductor block, and curing the surface protection film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3A-3C are cross-sectional side views illustrating manufacturing processes of the wiring board;

FIG. 4A-4C are cross-sectional side views illustrating manufacturing processes of the wiring board;

FIGS. 8A and 8B are cross-sectional side views illustrating manufacturing processes of the wiring board.

DETAILED DESCRIPTION OF THE EMBODIMENTS

Figure 1:
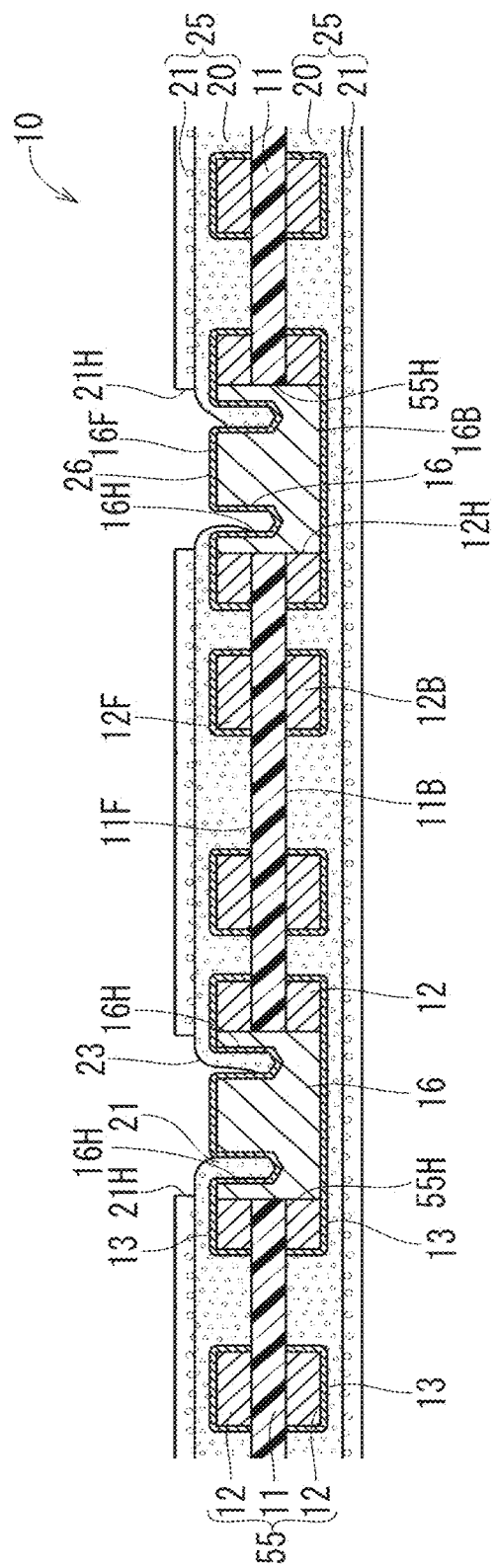
FIG. 1 is a cross-sectional side view of a wiring board according to a first embodiment of the present invention.

The embodiments will now be described with reference to the accompanying drawings, wherein like reference numerals designate corresponding or identical elements throughout the various drawings.

First Embodiment

In the following, a first embodiment of the present invention is described with reference to FIG. 1-6. FIG. 1 illustrates a cross-sectional structure of a wiring board 10 of the present embodiment.

As illustrated in FIG. 1, the wiring board 10 of the present embodiment is formed by respectively covering both sides of a substrate 55 with coverlays (25, 25) (corresponding to "surface protection films" according to an embodiment of the present invention). The substrate 55 is formed by respectively laminating conductor layers (12, 12) on both sides of an insulating layer 11, the conductor layers (12, 12) each having a wiring pattern. It is desirable that the insulating layer 11 be formed of a flexible insulating resin. As a material for the insulating layer 11, polyimide, glass epoxy, or the like can be used. A thickness of the insulating layer 11 is not particularly limited. However, it is desirable that the thickness of the insulating layer 11 be 12.5-75 μm.

It is desirable that the conductor layers 12 be each formed of a conductor having good electrical conductivity. As a material for the conductor layers 12, copper, nickel or the like can be used. Further, it is desirable that a thickness of each of the conductor layers 12 be substantially the same as that of the insulating layer 11. In the following, of the conductor layers 12, the one laminated on an F surface (11F), which is a front side surface of the insulating layer 11, is referred to as an F surface side conductor layer (12F), and the other one laminated on a B surface (11B), which is a back side surface of the insulating layer 11, is referred to as a B surface side conductor layer (12B).

Through holes (55H) that integrally penetrate the insulating layer 11 and the conductor layers (12, 12) are formed in the substrate 55. Conductor blocks 16 are respectively fitted in the through holes (55H). A front side surface (16F) of each of the conductor blocks 16 is positioned substantially coplanar with an upper surface of the F surface side conductor layer (12F), and a back side surface (16B) of each of the conductor blocks 16 is positioned substantially coplanar with a lower surface of the B surface side conductor layer (12B).

Figure 2:
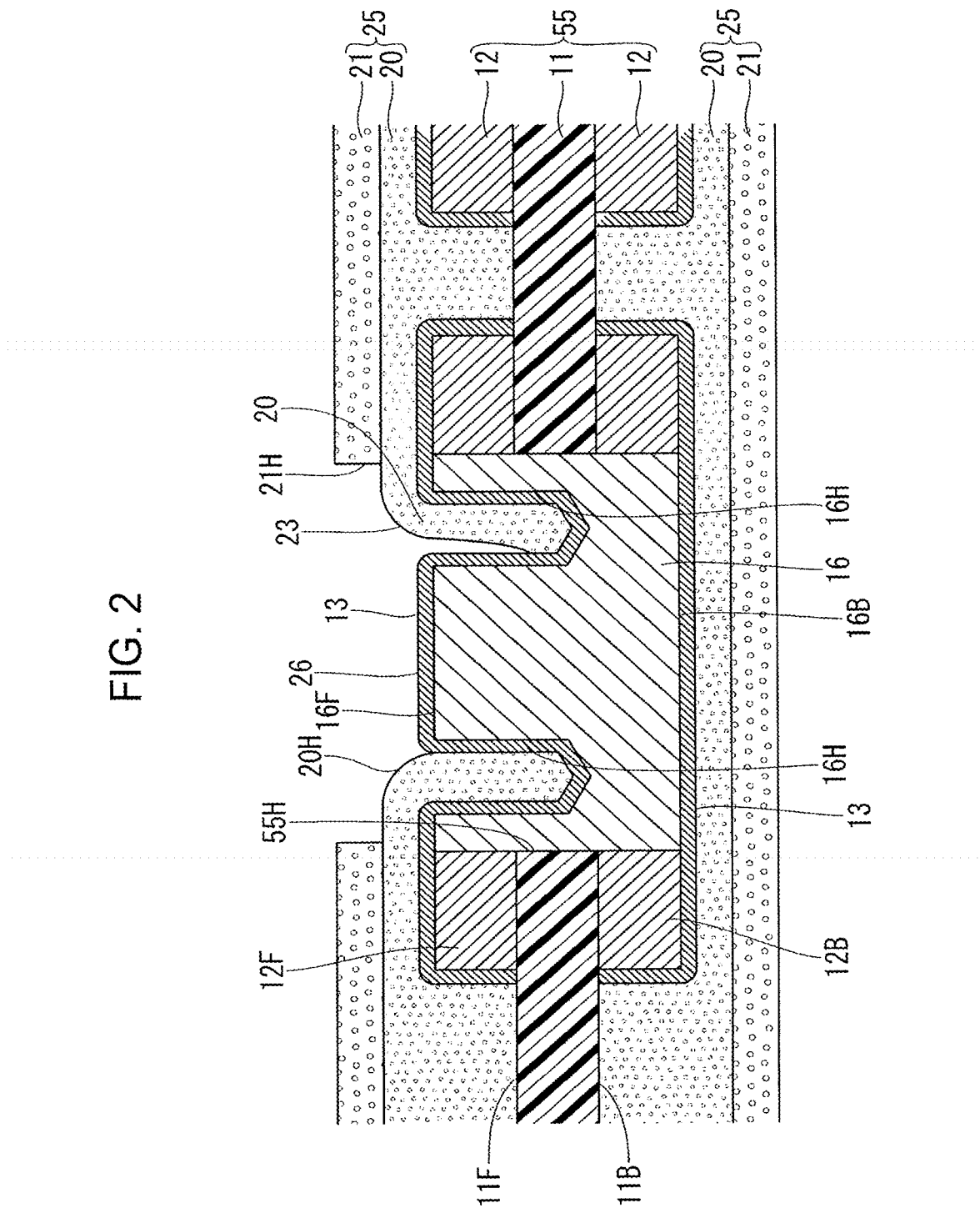
FIG. 2 is an enlarged cross-sectional side view of the wiring board.

As illustrated in FIG. 2, the coverlays (25, 25) each include a covering layer 21 that is foil led from a polyimide film or the like, and an adhesive layer 20 that bonds the substrate 55 and the covering layer 21 to each other. It is desirable that the adhesive layer 20 be formed of an insulating resin such as a photocurable resin or a thermosetting resin. As a material for the adhesive layer 20, for example, a polyimide-based adhesive, an epoxy-based adhesive or the like can be used.

Opening parts 23 (corresponding to "opening parts" according to an embodiment of the present invention) are formed in the coverlay 25 laminated on an F surface (55F) side of the substrate 55. Pads 26 are respectively formed on portions of the conductor blocks 16 on the F surface (16F) side exposed from the opening parts 23. It is desirable that, in each of the opening parts 23, an opening (21H) fainted in the covering layer 21 have a diameter in a range of 1000-2000 μm.

Here, in the wiring board 10 of the present embodiment, on the F surface (16F) side of each of the conductor blocks 16, an annular groove (16H) that surrounds the pad 26 and is adjacent to an outer edge of the pad 26 is formed. Then, an opening edge portion of an opening part (20H) of the adhesive layer 20 in each of the opening part 23 protrudes to an inner side of the opening (21H) formed in the covering layer 21 in each of the opening parts 23, and extends into the annular groove (16H). Further, the annular groove (16H) is formed on an inner side of the opening (21H) formed in the covering layer 21. The annular groove (16H) is formed on an inner side of an outer edge of each of the conductor blocks 16, and reaches a substantially middle position in a height direction of the substrate 55. Specifically, it is desirable that the annular groove (16H) have a width of 100-500 μm and a depth of 20-80 μm.

Further, a corrosion resistant metal film 13 is formed on the conductor layers 12 and the conductor blocks 16, including upper surfaces of the pads 26, and on inner walls of the annular grooves (16H). The F surface (16F) of each of the conductor blocks 16, on which a pad 26 is formed, and the inner wall of the annular groove (16H) are continuously covered by the corrosion resistant metal film 13.

The wiring board 10 of the present embodiment is manufactured as follows.

(1) As illustrated in FIG. 3A, the substrate 55 is prepared in which the conductor layers (12, 12) are respectively laminated on both sides of the insulating layer 11.

(2) As illustrated in FIG. 3B, the through holes (55H) penetrating the insulating layer 11 and the conductor layers (12, 12) are formed. Although not particularly limited, the through holes (55H) can be formed using a press, a drill, laser, or the like.

(3) As illustrated in FIG. 3C, the conductor blocks 16 are respectively inserted to be fitted in the through holes (55H). In this case, the conductor blocks 16 each have a thickness substantially the same as the substrate 55. As described above, the front side surface (16F) of each of the conductor blocks 16 is positioned substantially coplanar with the upper surface of the F surface side conductor layer (12F), and the back side surface (16B) of each of the conductor blocks 16 is positioned substantially coplanar with the lower surface of the B surface side conductor layer (12B).

(4) Next, as illustrated in FIG. 4A, an etching process is performed, and a pattern is formed on the substrate 11. Specifically, first, an etching resist is formed on the conductor layers (12, 12). Then, portions of the conductor layers (12, 12) that are not covered by the etching resist are removed by the etching process, and the pattern is fin tied. Then, the etching resist that is no longer needed is removed.

(5) Next, as illustrated in FIG. 4B, the annular groove (16H) having an annular shape is formed on the F surface (16F) side of each of the conductor blocks 16, for example, using laser. The annular groove (16H) is formed to be adjacent to the outer edge of the pad 26.

(6) Next, as illustrated in FIG. 4C, an electrolytic plating treatment is performed, and the corrosion resistant metal film 13 is formed covering the surfaces of the conductor layer 12 and the conductor blocks 16 and the inner walls of the annular grooves (16H).

Figure 5:
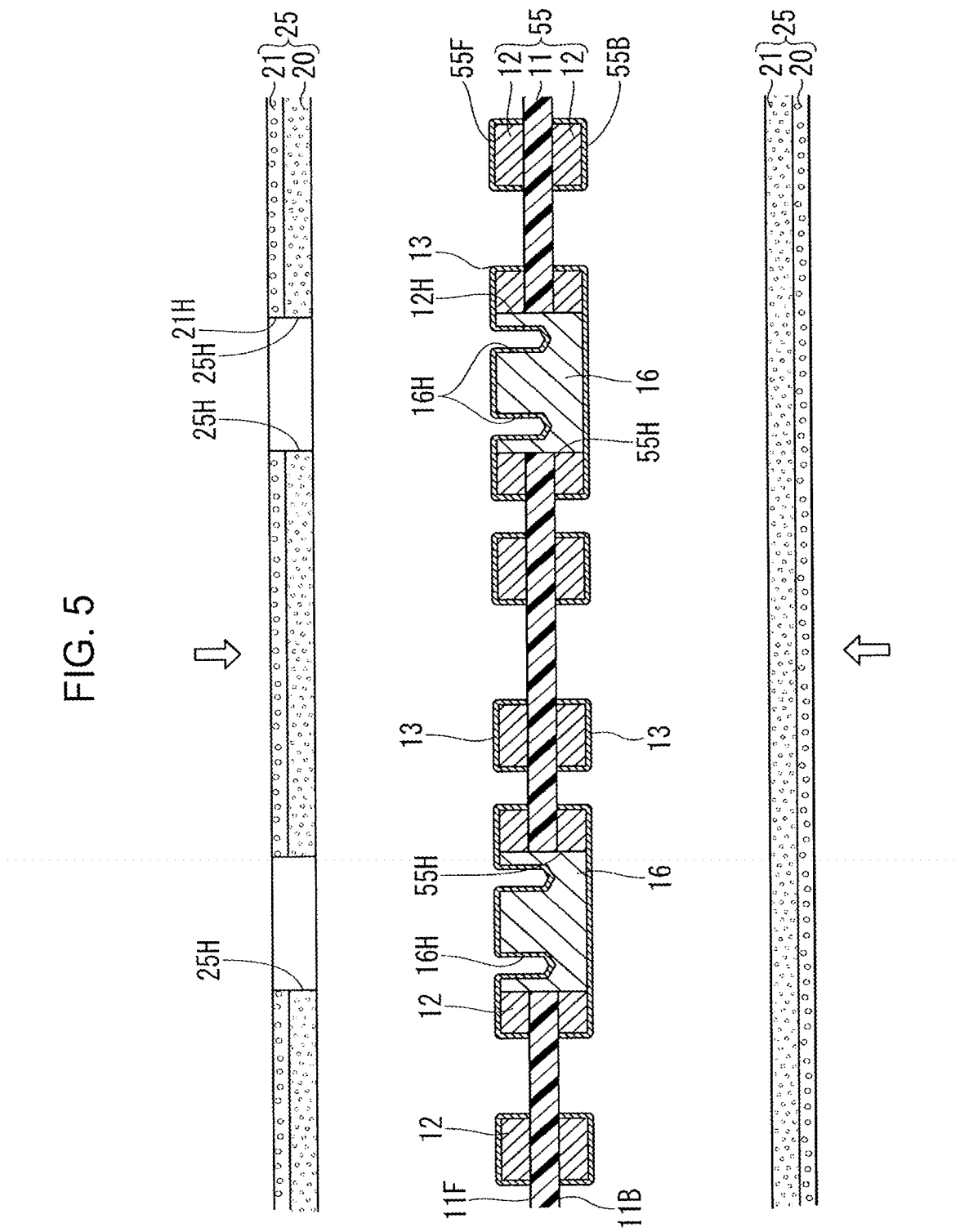
FIG. 5 is a cross-sectional side view illustrating a manufacturing process of the wiring board.

(7) Finally, as illustrated in FIG. 5, the coverlays (25, 25) are respectively laminated on both sides of the substrate 55. Specifically, the coverlays 25 are each formed from a film-like covering layer 21 and an adhesive layer 20 in a semi-cured state. By being heated and pressed in a state in which the coverlays (25, 25) are respectively overlaid on both sides of the substrate 55, the adhesive layers 20 change from the semi-cured state to a cured state. In this case, through holes (25H), each having a diameter larger than that of each of the annular grooves (16H) that are respectively formed on the conductor blocks 16, are formed in the coverlay 25 laminated on the F surface (55F) side of the substrate 55. Then, the coverlay 25 is overlaid on the substrate 55 such that the annular grooves (16H) are respectively formed on inner sides of the through holes (25H).

As described above, when heat and press are applied, the adhesive layers 20 are in a semi-cured state. As a result, when pressed in the state in which the coverlays 25 are overlaid on the substrate 55, the adhesive layers 20 deform in accordance with unevenness of the conductor layers 12 and the like, and edges portions of the openings of the adhesive layer 20 respectively protrude to inner sides of the openings (21H) of the covering layer. Then, since the annular grooves (16H) are respectively formed at the places where the opening edge portions of the adhesive layer 20 protrude, the protruding opening edge portions of the adhesive layer 20 are respectively received by the annular grooves (16H). Then, the adhesive layers 20 are cured in the state in which the protruding opening edge portions have respectively extends into the annular grooves (16H). As a result, the wiring board 10 illustrated in FIG. 1 is completed.

Figure 6:
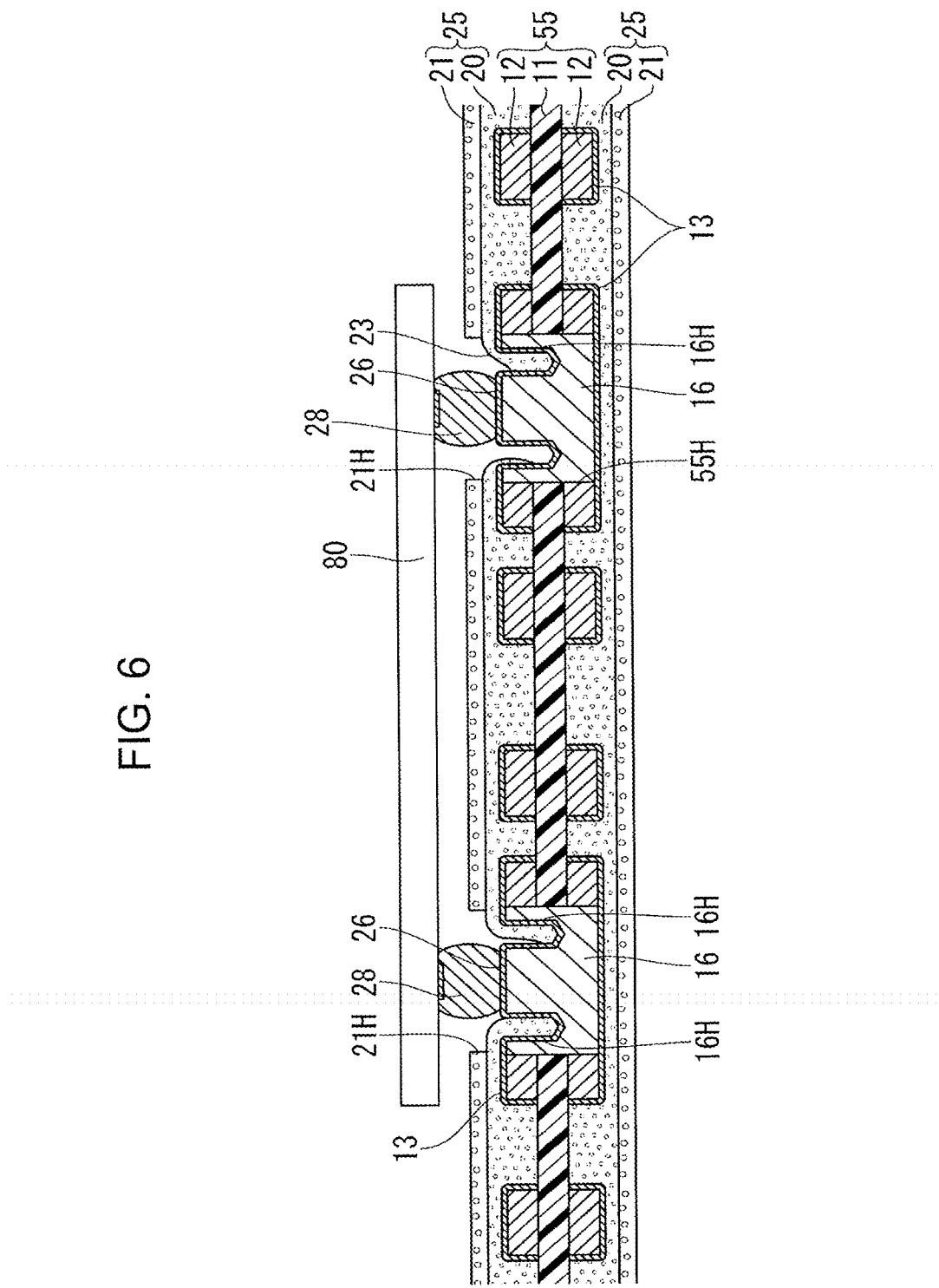
FIG. 6 is a cross-sectional side view illustrating an example of use of the wiring board.

The description about the structure and the manufacturing method of the wiring board 10 of the present embodiment is as given above. Next, an example of use and an operation effect of the wiring board 10 are described. The wiring board 10 of the present embodiment, for example, as illustrated in FIG. 6, is used by forming solder bumps 28 on the pads 26 and mounting and soldering an LED 80 or the like on the solder bumps 28.

However, when the coverlay 25, in which the through holes (25H) are formed, is laminated on the substrate 55, and is heated and pressed, the adhesive layer 20 of the coverlay 25 is likely to protrude to inner sides of the through holes (25H). Therefore, there was a problem that the pads become smaller in size than designed or are shifted in position, and thus connections between the pads and the solder bumps deteriorate.

In contrast, in the wiring board 10 of the present embodiment, in the substrate 55, the annular grooves (16H) that are respectively formed on the inner sides of the through holes (25H) of the coverlay 25 are formed, and the pads 26 are respectively provided on the inner sides of the annular grooves (16H). As a result, of the coverlay 25, the portions of adhesive layer 20 that respectively protrude to the inner sides of the opening (21H) of the covering layer 21 respectively extends into the annular grooves (16H), and thus the protruding portions of the adhesive layer 20 are prevented from eroding the pads 26 that are respectively adjacent to inner sides of the annular grooves (16H). Therefore, variation in size or shift in position of the pads 26 can be suppressed, and connectivity of the pads 26 can be improved.

Further, it is conceivable that when the annular grooves (16H) are formed to penetrate the conductor blocks 16, due to the annular grooves (16H), the pads 26 and the conductor layers 12 are no longer electrically connected to each other. However, the annular grooves (16H) are respectively formed on inner sides of outer edges of the conductor blocks 16 at a depth reaching a middle position of each of the conductor blocks 16. Therefore, by bypassing the annular grooves (16H) from below, the pads 26 and the conductor layers 12 can be electrically connected to each other.

Second Embodiment

Figure 7:
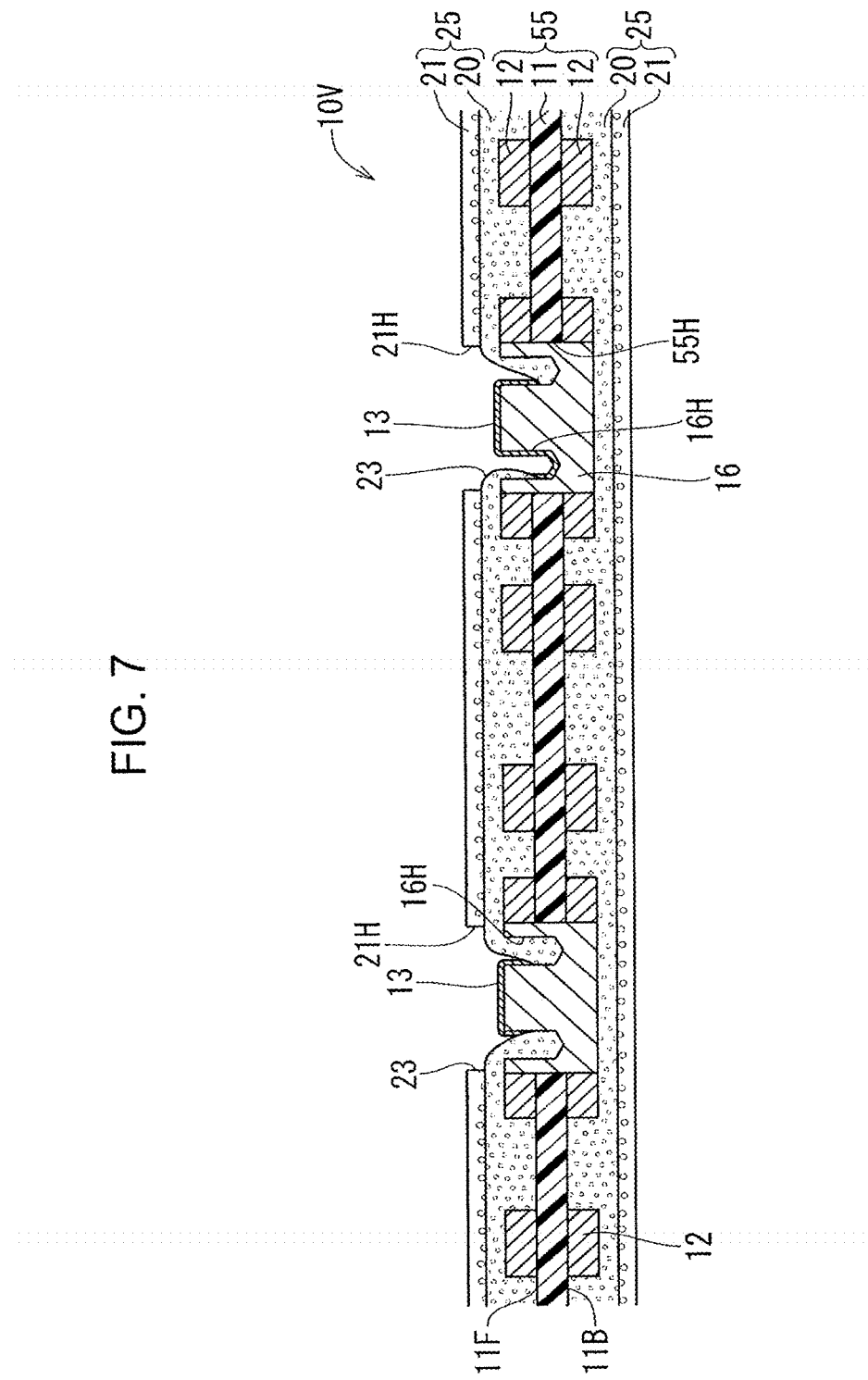
FIG. 7 is a cross-sectional side view of a wiring board according to a second embodiment of the present invention.

As illustrated in FIG. 7, a wiring board (10V) of the present embodiment is different from the first embodiment in the timing to form the corrosion resistant metal film 13. In the following, with respect to a method for manufacturing the wiring board (10V) of the present embodiment, a difference from the above first embodiment is mainly described.

(1) Following the process (5) of the manufacturing method of the first embodiment, as illustrated in FIGS. 8A and 8B, the coverlays (25, 25) are respectively laminated on both sides of the substrate 55.

(2) Then, an electrolytic plating treatment is performed. As illustrated in FIG. 7, the corrosion resistant metal film 13 is formed on the pads 26 and on portions of the inner walls of the annular grooves (16H) exposed from the adhesive layer 20 of the coverlay 25.

As a result, the wiring board (10V) of the present embodiment illustrated in FIG. 7 is completed. In the wiring board (10V), the corrosion resistant metal film 13 is formed on the pads 26 and on the portions of the inner walls of the annular grooves (16H) exposed from the adhesive layer 20 of the coverlay 25.

Other Embodiments

The present invention is not limited to the above-described embodiments. For example, the embodiments described below are also included in the technical scope of the present invention. Further, in addition to the embodiments described below, the present invention can also be embodied in various modified forms within the scope without departing from the spirit of the present invention.

In the above embodiments, the wiring board 10 is a flexible substrate. However, it is also possible that the wiring board 10 is a rigid substrate.

In the above embodiments, the conductor blocks 16 are formed to penetrate the insulating layer 11. However, it is also possible that recesses are formed in the insulating layer 11 to embed the conductor blocks 16.

In the above embodiments, the electronic component mounted on the pads 26 is the LED 80. However, it is also possible that the electronic component is a power semiconductor or the like.

In the above embodiments, the pads 26 are respectively formed on the conductor blocks 16. However, it is also possible that the pads 26 are formed at places other than above the conductor blocks 16.

In the above embodiments, the pads 26 are formed only on the F surface (55F) of the substrate 55. However, it is also possible that the pads 26 are formed on both sides of the substrate 55. In this case, it is possible that the annular grooves 16 are formed on both sides or on only one side.

In the above embodiments, the annular grooves (16H) are formed at a depth reaching a middle position of the conductor blocks 16. However, it is also possible that the annular grooves (16H) are formed to penetrate the conductor blocks 16. In this case, there is no longer electrical connection to the conductor blocks 16, and the conductor blocks 16 can only be used for heat radiation.

In the above embodiments, the annular grooves (16H) are formed substantially perpendicular to the conductor blocks 16. However, it is also possible that a front end side of each of the annular groove (16H) is inclined toward an inner side or is inclined toward an outer side. As a result, when the annular grooves (16H) are formed on both upper and lower sides of the conductor blocks 16, the annular grooves (16H) can be ensured to have a sufficient depth.

In a wiring board, there is a risk that variation in position or size of pads may occur, and connection failures of the pads may occur.

In a wiring board according to an embodiment of the present invention, a surface protection film having an opening part is laminated on a substrate in which a conductor block is embedded, and a pad provided on a portion of the substrate that is exposed from the opening part. The pad and an annular groove surrounding the pad are formed on the conductor block. A portion of the surface protection film extends into the annular groove.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring board, comprising:
   a substrate;
   a surface protection film laminated on the substrate and having an opening portion; and
   a conductor block embedded in the substrate and having a pad portion such that the pad portion is formed on a first surface of the conductor block and exposed by the opening portion of the surface protection film,
   wherein the conductor block has an annular groove formed on the first surface of the conductor block such that the annular groove is positioned on an inner side of an outer edge of the conductor block and surrounding the pad portion of the conductor block, and the surface protection film is formed such that a portion of the surface protection film is extending into the annular groove, the substrate comprises an insulating layer, a first conductor layer formed on a surface of the insulating layer, and a second conductor layer formed on an opposite surface of the insulating layer, and the conductor block is embedded in a through hole penetrating through the first conductor layer, the insulating layer and the second conductor layer such that the conductor block is in contact with side surfaces of the first and second conductor layers inside the through hole and the first surface and a second surface of the conductor block, opposite to the first surface, are substantially coplanar with upper and lower surfaces of the first and second conductor layers respectively.

2. A wiring board according to claim 1, wherein the surface protection film comprises a covering layer and an adhesive layer bonding the covering layer to the substrate, and the adhesive layer has the portion of the surface protection film extending into the annular groove.

3. A wiring board according to claim 2, wherein the surface protection film is laminated on the substrate such that the annular groove is positioned inside the opening portion and that the adhesive layer has a portion extending inside the opening portion and into the annular groove.

4. A wiring board according to claim 3, further comprising:
a corrosion resistant metal film formed on the conductor block such that the corrosion resistant metal film is covering a surface of the pad portion and an inner wall of the annular groove.

5. A flexible substrate comprising the wiring board of claim 3.

6. A wiring board according to claim 2, wherein the conductor block has the annular groove formed on the surface of the conductor block such that the annular groove has a depth reaching a substantially middle position in a height direction of the substrate.

7. A wiring board according to claim 2, further comprising:
a corrosion resistant metal film formed on the conductor block such that the corrosion resistant metal film is covering a surface of the pad portion and an inner wall of the annular groove.

8. A flexible substrate comprising the wiring board of claim 2.

9. A wiring board according to claim 1, wherein the conductor block has the annular groove formed on the surface of the conductor block such that the annular groove has a depth reaching a substantially middle position in a height direction of the substrate.

10. A wiring board according to claim 9, further comprising:
a corrosion resistant metal film formed on the conductor block such that the corrosion resistant metal film is covering a surface of the pad portion and an inner wall of the annular groove.

11. A flexible substrate comprising the wiring board of claim 9.

12. A wiring board according to claim 1, further comprising:
a corrosion resistant metal film formed on the conductor block such that the corrosion resistant metal film is covering a surface of the pad portion and an inner wall of the annular groove.

13. A flexible substrate comprising the wiring board of claim 12.

14. A flexible substrate comprising the wiring board of claim 1.

15. A wiring board according to claim 1, wherein the conductor block is formed in a plurality such that the plurality of conductor blocks is embedded in the substrate and positioned to mount a component on a surface of the substrate.

16. A method for manufacturing a wiring board, comprising:
providing a substrate having a conductor block embedded in the substrate;
forming an annular groove on a first surface of the conductor block such that the annular groove is positioned on an inner side of an outer edge of the conductor block and surrounds a portion of the first surface of the conductor block;
forming, on the substrate, a surface protection film having an opening portion in a semi-cured state such that the surface protection film is laminated on the substrate in the semi-cured state and has a portion extending into the annular groove;
forming a pad portion in the portion of the conductor block exposed by the opening portion of the surface protection film such that the annular groove surrounds the pad portion of the conductor block; and
curing the surface protection film,
wherein the substrate comprises an insulating layer, a first conductor layer formed on a surface of the insulating layer, and a second conductor layer formed on an opposite surface of the insulating layer, and the conductor block is embedded in a through hole penetrating through the first conductor layer, the insulating layer and the second conductor layer such that the conductor block is in contact with side surfaces of the first and second conductor layers inside the through hole and the first surface and a second surface of the conductor block, opposite to the first surface, are substantially coplanar with upper and lower surfaces of the first and second conductor layers respectively.

17. A method for manufacturing a wiring board according to claim 16, wherein the surface protection film comprises a covering layer and an adhesive layer bonding the covering layer to the substrate, and the adhesive layer has the portion of the surface protection film extending into the annular groove.

18. A method for manufacturing a wiring board according to claim 16, wherein the forming of the surface protection film comprises laminating the surface protection film on the substrate such that the annular groove is positioned inside the opening portion.

19. A method for manufacturing a wiring board according to claim 16, further comprising:
forming a corrosion resistant metal film on the conductor block prior to the forming of the surface protection film such that the corrosion resistant metal film covers and an inner wall of the annular groove and a surface of the portion of the conductor block exposed by the opening portion of the surface protection film.

20. A method for manufacturing a wiring board according to claim 16, further comprising:
forming a corrosion resistant metal film on the conductor block such that the corrosion resistant metal film covers part of the conductor block exposed from the surface protection film.

* * * * *